(12) United States Patent
Saboundji et al.

(10) Patent No.: US 10,982,333 B2
(45) Date of Patent: Apr. 20, 2021

(54) PART COMPRISING A NICKEL-BASED MONOCRYSTALLINE SUPERALLOY SUBSTRATE AND METHOD FOR MANUFACTURING SAME

(71) Applicant: SAFRAN, Paris (FR)

(72) Inventors: Amar Saboundji, Moissy-Cramayel (FR); Virginie Jaquet, Moissy-Cramayel (FR); Jeremy Rame, Moissy-Cramayel (FR)

(73) Assignee: SAFRAN, Paris (FR)

( * ) Notice: Subject to any disclaimer, the term of this patent is extended or adjusted under 35 U.S.C. 154(b) by 200 days.

(21) Appl. No.: 16/345,189

(22) PCT Filed: Oct. 19, 2017

(86) PCT No.: PCT/FR2017/052880
§ 371 (c)(1),
(2) Date: Apr. 25, 2019

(87) PCT Pub. No.: WO2018/078246
PCT Pub. Date: May 3, 2018

(65) Prior Publication Data
US 2019/0284703 A1    Sep. 19, 2019

(30) Foreign Application Priority Data
Oct. 27, 2016    (FR) ...................................... 1660417

(51) Int. Cl.
*B32B 15/04*    (2006.01)
*C23C 28/00*    (2006.01)
(Continued)

(52) U.S. Cl.
CPC .......... *C23C 28/3455* (2013.01); *B32B 15/04* (2013.01); *C23C 10/28* (2013.01);
(Continued)

(58) Field of Classification Search
None
See application file for complete search history.

(56) References Cited

U.S. PATENT DOCUMENTS

| | | | | |
|---|---|---|---|---|
| 7,011,894 B2* | 3/2006 | Saint Ramond | ...... | C23C 28/321 428/632 |
| 7,311,981 B2* | 12/2007 | Saint Ramond | ........ | C23C 14/00 416/241 R |

FOREIGN PATENT DOCUMENTS

| | | |
|---|---|---|
| EP | 1191125 A1 | 3/2002 |
| EP | 1528118 A2 | 5/2005 |

OTHER PUBLICATIONS

Preliminary Research Report received for French Application No. 1660417, dated Jun. 12, 2017, 3 pages (1 page of French Translation Cover Sheet and 2 pages of original document).

(Continued)

*Primary Examiner* — Daniel J Schleis
(74) *Attorney, Agent, or Firm* — Womble Bond Dickinson (US) LLP

(57) ABSTRACT

The invention relates to a method for manufacturing a part (1) comprising a nickel-based monocrystalline superalloy substrate (2). This method is characterised in that it comprises the steps that consist of: manufacturing a nickel-based monocrystalline superalloy substrate (2); forming a coating (3) on said substrate (2), comprising at least one layer (30) of a first type comprising aluminum and platinum, at least one layer (31) of a second type comprising aluminium, silicon, platinum and a layer (32) of a third type comprising nickel, aluminium, silicon and platinum, said layer (32) of the third type being the outermost layer of the stack of coating layers (3); and forming a layer (4) of silicon-doped alumina on said layer (32) of the third type.

11 Claims, 3 Drawing Sheets

(51) Int. Cl.
*C23C 14/08* (2006.01)
*C23C 14/16* (2006.01)
*C23C 10/28* (2006.01)
*C23C 14/34* (2006.01)

(52) U.S. Cl.
CPC .......... *C23C 14/081* (2013.01); *C23C 14/165* (2013.01); *C23C 28/321* (2013.01); *C23C 28/42* (2013.01); *B32B 2250/04* (2013.01); *B32B 2250/05* (2013.01); *B32B 2255/06* (2013.01); *B32B 2255/205* (2013.01); *B32B 2307/306* (2013.01); *C23C 14/34* (2013.01); *Y02T 50/60* (2013.01)

(56) References Cited

OTHER PUBLICATIONS

International Search Report and Written Opinion received for PCT Patent Application No. PCT/FR2017/052880, dated Dec. 8, 2017, 15 pages (7 pages of English Translation and 8 pages of Original Document).

\* cited by examiner

PART COMPRISING A NICKEL-BASED MONOCRYSTALLINE SUPERALLOY SUBSTRATE AND METHOD FOR MANUFACTURING SAME

GENERAL TECHNICAL FIELD

The invention is in the field of nickel-based single-crystal superalloys.

More specifically, the present invention relates to a process for manufacturing a part comprising a nickel-based single-crystal superalloy substrate, as well as a part comprising a nickel-based single-crystal superalloy substrate.

STATE OF THE ART

The term "superalloys" refers to complex alloys which, at high temperature and pressure, exhibit very good resistance to oxidation, corrosion, creep and cyclic stresses (notably mechanical or thermal). A particular application of these superalloys is in the manufacture of parts used in aeronautics, for instance turbine blades.

Parts that comprise, successively from the inside to the outside, a nickel-based single-crystal superalloy substrate, one or more undercoat(s) and a thermal barrier are already known in the state of the art.

Figure 1:
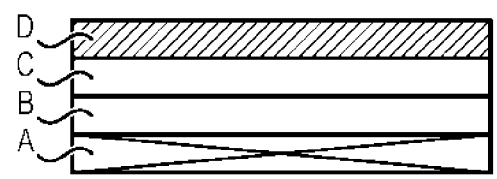

In the attached FIG. 1, a schematic cross-sectional representation of an example of such a part can be seen. This comprises successively a nickel-based single-crystal superalloy substrate A, a bond coat B of an alloy selected from NiAlPt, MCrAlY with M equal to Co and/or Ni, a layer C of an oxide such as alumina, and finally a thermal barrier D.

Numerous studies have shown that interdiffusion of chemical components between a superalloy and its coating, as well as oxidation of the grain boundaries of the alumina layer by oxygen diffusion, can have negative consequences on the life of the part.

When the above-mentioned part is for example a turbine blade, used at temperatures comprised between 800° C. and 1600° C., it can be seen that interdiffusion is significant between the superalloy of the substrate and the different layers that cover it, due to their different chemical compositions. For example, the aluminium of the bond coat B can diffuse to the substrate A or the titanium of the substrate can diffuse to the bond coat B. The diffusion fluxes associated with this phenomenon can have different consequences.

First, the above-mentioned fluxes lead to the premature depletion of the alumina layer C, which promotes the martensitic transformation of the bond coat B (β-NiAl phase transformed into γ'-Ni3Al phase). These transformations generate cracks and promote flaking of the oxide layer.

Next, the diffusion of certain elements of the superalloy, such as titanium, or certain impurities, such as sulphur, will degrade the adhesion between the oxide layer C and the thermal barrier D.

On the other hand, interdiffusion can lead to the formation of secondary reaction zones (SRZ) which will significantly degrade the mechanical properties (creep, fatigue strength) of the coated superalloy.

Finally, when the above-mentioned part is a turbine blade, hot gases from the combustion chamber (mainly oxygen) diffuse through the porous thermal barrier until they reach the alumina layer. This leads to oxidation of the grain boundaries of the alumina layer and swelling of the latter. This evolution is accompanied by long-term compressive stresses due to the growth of grain boundaries, leading to surface undulations of the bond coat B (known as "rumpling") and a loss of adhesion (flaking) of thermal barrier D. It is interesting to note that this phenomenon is further increased in the case where the bond coat B is in the form of a β-(Ni,Pt)Al phase, because the difference in composition between this bond coat B and the superalloy of the substrate A is significant.

In order to limit the negative consequences of interdiffusion and to increase the life of coated superalloys, a solution is already known from the state of the art, consisting of interposing a diffusion barrier, with a thickness of a few micrometres, between the superalloy substrate A and the bond coat B.

This diffusion barrier consists, for example, of a dense layer of alumina or a rhenium-based alloy and it has been found that the diffusion of certain elements of the superalloy of the substrate A (such as titanium or sulphur, for example) is slowed down in this diffusion barrier.

However, the use of this diffusion barrier reduces thermal fatigue strength of the part, taking into account the differences in thermal expansion coefficients between the diffusion barrier, the base coat B and the substrate A. In addition, crack initiation is accentuated at the diffusion barrier during mechanical fatigue stresses.

PRESENTATION OF THE INVENTION

The objective of the invention is therefore to propose a technical solution for obtaining a nickel-based single-crystal superalloy substrate covered with a coating and a layer of alumina, while:
- limiting the interdiffusion phenomena between the superalloy substrate and the layers of said coating, without degrading the mechanical properties of the superalloy;
- limiting the oxidation of the grain boundaries of the alumina layer;
- and, increasing the life of the complete system (coated substrate).

When the alumina layer is further coated with a thermal barrier, another objective of the invention is to improve the adhesion between the alumina layer and thermal barrier.

To that end, the invention relates to a process for manufacturing a part comprising a nickel-based single-crystal superalloy substrate.

In accordance with the invention, this process comprises the steps consisting in:
- manufacturing a nickel-based single-crystal superalloy substrate,
- forming, on said substrate, a coating comprising at least one layer of a first type comprising aluminium and platinum, at least one layer of a second type comprising aluminium, silicon and platinum and a layer of a third type comprising nickel, aluminium, silicon and platinum, this third-type layer being furthest outside the layer stack of the coating,
- forming a silicon-doped alumina layer on said third-type layer.

Thanks to these features of the invention, the different layers of the coating limit the interdiffusion phenomena between the superalloy of the substrate and the alumina layer, without degrading the mechanical properties of these superalloys.

Furthermore, the silicon diffuses into the alumina layer, which thus constitutes an effective diffusion barrier against oxygen from the external atmosphere.

Finally, the life of the part obtained by this process is increased.

According to other advantageous and non-limiting features of the invention, taken alone or in combination:

said coating comprises at least three first-type layers;
said coating comprises two second-type layers;
said coating comprises a succession of first-type layers and/or a succession of second-type layers;
in said coating, the layer in contact with the nickel-based single-crystal superalloy substrate is a first-type layer;
at least one of the layers among the first-type layer, the second-type layer and the third-type layer is formed:
for said first-type layer by depositing a nanocrystalline layer of aluminium and then a nanocrystalline layer of platinum or vice versa,
for said second-type layer by depositing, in any order, a nanocrystalline layer of aluminium, a nanocrystalline layer of platinum and a nanocrystalline layer of silicon,
and for said third-type layer by depositing, in any order, a nanocrystalline layer of aluminium, a nanocrystalline layer of platinum, a nanocrystalline layer of nickel and a nanocrystalline layer of silicon, and said nanocrystalline layers are subjected to a diffusion treatment, so as to form said coating;
the deposition of the different layers of the coating is carried out by physical vapour deposition or chemical vapour deposition;
the deposition of the different layers of the coating is carried out by cathode sputtering;
it comprises an additional step consisting in depositing a thermal barrier on said silicon-doped alumina layer.

The invention also relates to a part comprising a nickel-based single-crystal superalloy substrate.

In accordance with the invention, the part successively comprises on said substrate a coating covered with a silicon-doped alumina layer, said coating comprising at least one layer of a first type comprising aluminium and platinum, at least one layer of a second type comprising aluminium, silicon and platinum and a layer of a third type comprising nickel, aluminium, silicon and platinum, this third-type layer being furthest outside the layer stack of the coating.

Advantageously, said silicon-doped alumina layer is covered with a thermal barrier.

PRESENTATION OF THE FIGURES

Other features and advantages of the invention will become apparent from the description that will now be made, with reference to the annexed drawings, which represent, by way of non-limiting illustration, several possible embodiments.

Figure 2:
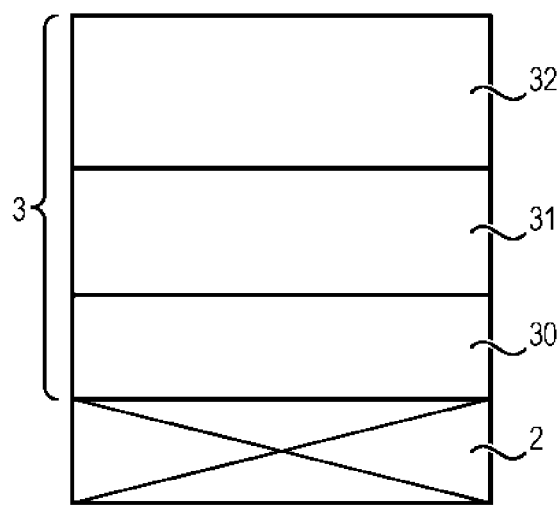
Figure 3:
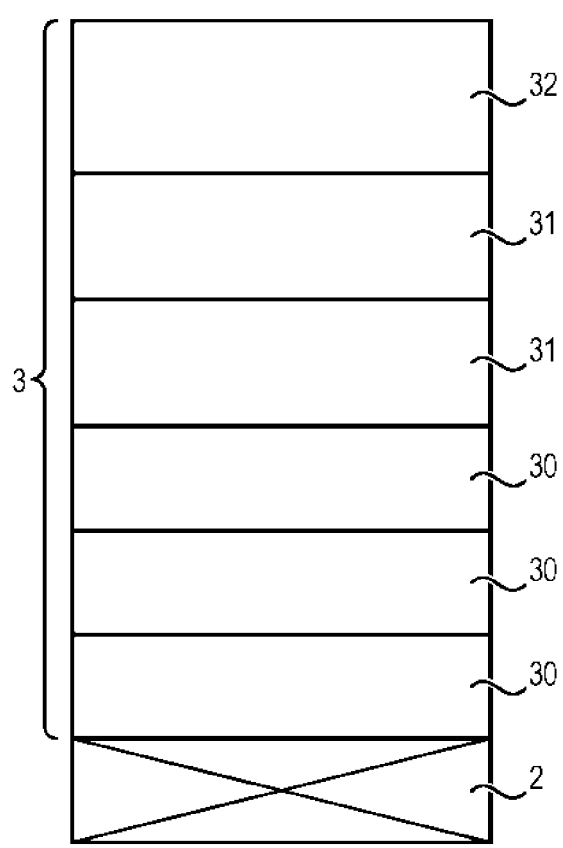
Figure 4:
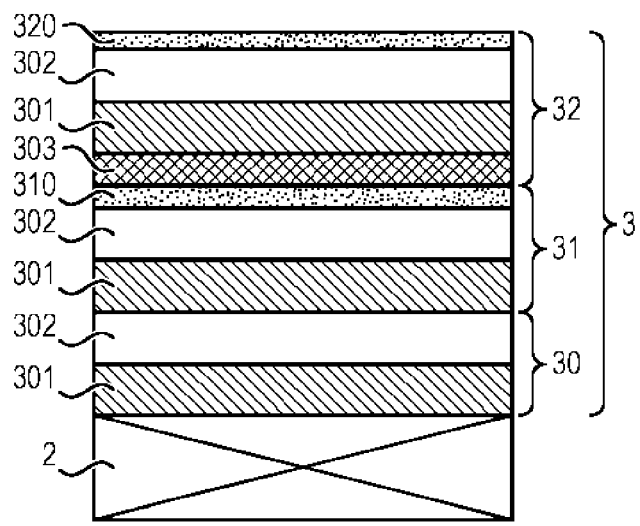
Figure 5:
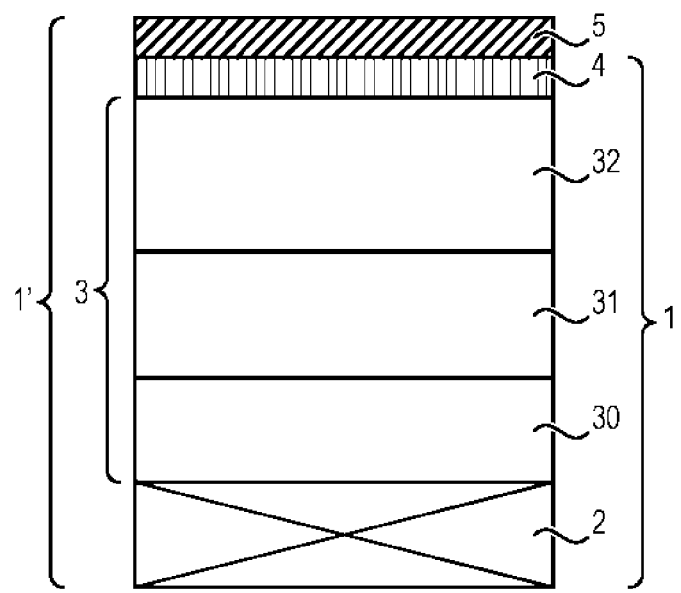

On these drawings:

FIG. 1 is a schematic cross-sectional view of a part according to the state of the art comprising a nickel-based single-crystal superalloy substrate covered with several coats, and FIG. 2 is a schematic cross-sectional view of a substrate covered with a coating in accordance with one embodiment of the invention, FIG. 3 is a schematic cross-sectional view of a substrate covered with a coating in accordance with another embodiment of the invention, FIG. 4 is a schematic cross-sectional view of the detail of the different layers deposited to form the coating of the substrate according to a particular embodiment, FIG. 5 is a schematic cross-sectional view of two embodiments of a part in accordance with the invention.

DETAILED DESCRIPTION

The process for manufacturing a part in accordance with the invention will now be described.

According to a first embodiment of the invention shown in FIG. 5, the finished part, with reference sign 1, comprises a substrate 2, covered with a multilayer coating 3, itself covered with an alumina layer 4.

According to a second embodiment of the invention shown in the same figure, the alumina layer 4 is covered with a thermal barrier layer 5. The finished part has the reference sign 1'.

The substrate 2 is made of a nickel-based single-crystal superalloy.

This substrate is for example obtained by casting or additive manufacturing and has the desired final shape, for example that of a turbine blade.

By way of purely illustrative examples, the superalloys useful for the manufacture of the substrate 2 are those mentioned in Table 1 below. They are identified by the letters A to F. Other nickel-based single-crystal superalloys can also be used.

TABLE 1

| Exemplary nickel-based single-crystal superalloys | | | | | | | | | | | |
|---|---|---|---|---|---|---|---|---|---|---|---|
| Alloy elements (mass percentages) | | | | | | | | | | | |
| | Ni | Al | Co | Cr | Mo | Re | Ta | Ti | W | Cb | Ru |
| A | Remainder | 5.2 | 6.5 | 7.8 | 2 | 0 | 7.9 | 1.1 | 5.7 | | |
| B | Remainder | 5.6 | 9.6 | 6.5 | 0.6 | 3 | 6.5 | 1 | 6 | | |
| C | Remainder | 5.73 | 9.6 | 3.46 | 0.6 | 4.87 | 8.28 | 0.86 | 5.5 | | |
| D | Remainder | 5.7 | 3 | 2 | 0.4 | 6 | 8 | 0.2 | 5 | 0.1 | |
| E | Remainder | 5.8 | 12.5 | 4.2 | 1.4 | 5.4 | 7.2 | 0 | 6 | | |
| F | Remainder | 6 | <0.2 | 4 | 1 | 4 | 5 | 0.5 | 5 | | 4 |

The term "remainder" corresponds, for each superalloy, to the residual mass percentage to reach 100% with the various other components mentioned.

As shown in FIG. 2, the coating 3, formed on the substrate 2, comprises at least one layer 30 comprising aluminium and platinum, referred to as "layer of a first type", at least one layer 31 comprising aluminium, silicon and platinum, referred to as "layer of a second type", and a layer 32 comprising nickel, aluminium, silicon and platinum, referred to as "layer of a third type". The third-type layer 32 is furthest outside the layer stack of the coating 3. In other words, it is the furthest from the substrate 2.

Preferably, the coating 3 comprises at least three first-type layers. Also preferably, the coating 3 comprises two second-type layers 31. The different layers 30 and 31 can be alternated but this is not obligatory.

It is also possible to have a succession of layers 30 of the first type and/or a succession of layers 31 of the second type.

Thus, for example, in FIG. 3, which illustrates another variant embodiment, the coating 3 comprises three successive first-type layers 30, then two successive second-type layers 31 and finally a third-type layer 32.

Preferably, the layer in contact with the substrate 2 is a first-type layer 30.

Advantageously, the different constitutive layers of the coating 3 are made on the same deposition apparatus. They can be deposited by different physical vapour deposition (PVD) or chemical vapour deposition (CVD) processes.

Examples of physical vapour deposition include the use of electron beam chemical vapour deposition (EBPVD), evaporation, pulsed laser ablation or sputtering (cathode sputtering). The latter technique is preferred. It has the advantage of allowing the formation of dense films of nanometric or micrometric thickness having superior adhesion to the previous layer better than that obtained with other deposition techniques.

Examples of chemical vapour deposition (CVD) techniques include:
  plasma enhanced chemical vapour deposition (PECVD),
  low-pressure chemical vapour deposition (LPCVD),
  ultra-high vacuum chemical vapour deposition (UHVCVD),
  atomic pressure chemical vapour deposition (APCVD), and
  atomic layer chemical vapour deposition (ALCVD).

It should be noted, however, that platinum can only be deposited by PVD or by electrodeposition.

According to a first embodiment, at least one of the layers 30, 31, 32 of the coating 3 is formed by co-deposition of the different chemical elements constituting this layer.

This co-deposition can thus be carried out, for example, from a single alloyed target containing the various chemical elements constituting said layer to be formed. For example, to form the second-type layer 31, an alloyed target containing aluminium, platinum and silicon can be used.

This co-deposition can also be carried out, for example, from several different targets, each containing one of the chemical elements constituting the layer to be formed. For example, to form the third-type layer 32, four targets can be used simultaneously, namely an aluminium target, a nickel target, a silicon target and a platinum (or chromium) target.

Regardless of the type of co-deposition chosen, this technique makes it possible to obtain the layers 30, 31 and 32 in the form of alloys, (respectively an Al/Pt alloy for the first-type layer 30, an Al/Pt/Si alloy for the second-type layer 31 and an Al/Pt/Si/Ni alloy for the third-type layer 32).

According to a second embodiment of the invention, shown in FIG. 4, it is also possible to form the different layers of the coating 3 as follows.

For the first-type layer 30, a nanocrystalline layer of platinum 301 is deposited, followed by a nanocrystalline layer of aluminium 302, or vice versa.

For the second-type layer 31, a nanocrystalline layer of aluminium 302, a nanocrystalline layer of platinum 301 and a nanocrystalline layer of silicon 310 are deposited in any order.

Finally, for the third-type layer 32, a nanocrystalline layer of aluminium 302, a nanocrystalline layer of platinum 301, a nanocrystalline layer of nickel 303 and a nanocrystalline layer of silicon 320 are deposited in any order.

The term "nanocrystalline" means that the crystals (grains) that make up these layers of polycrystalline material are less than 1 micrometre (1 µm) in size.

Advantageously, the two silicon layers 310, 320 have a thickness of less than 100 nm. Preferably, the nickel layer 303 has a thickness of less than 100 nm.

Also advantageously, platinum layers 301 and/or aluminium layers 302 have a thickness of less than 1 micrometre (1 µm).

Once the different layers of the coating 3 have been formed, a diffusion treatment is carried out by heating to a temperature comprised preferably between 200° C. and 1200° C.

It will be noted that after the diffusion treatment, the layers 30, 31, 32 obtained remain nanocrystalline.

The alumina layer 4 is then formed on the third-type layer 32. To do this, preferably, the substrate 2 covered with the coating 3 is subjected to a heat treatment under partial pressure of oxygen, or of oxygen and argon.

Advantageously, this heat treatment includes a step of temperature increase until a temperature comprised between 900° C. and 1200° C. is reached, a step of maintaining this temperature for less than one hour and a step of cooling until room temperature is reached.

Finally, when the substrate 1' is desired, the thermal barrier 5 is deposited on the alumina layer 4.

This thermal barrier is a layer of yttriated zirconia, for example, or an alternation of at least one yttriated zirconia layer (containing yttrium) and at least one ceramic layer.

Preferably, said thermal barrier 5 is deposited by electron beam physical vapour deposition (EBPVD).

The roles of the different layers are as follows.

The platinum 301 and aluminium 302 layers are nanocrystalline, which increases the total surface area of the grain boundaries, forming a good diffusion barrier, to limit interdiffusion between the superalloy of the substrate 2 and its coating 3. Furthermore, the grain boundaries of these platinum and aluminium layers also limit corrosion and oxidation of the substrate 2.

Another advantage resulting from the fact that the coating 3 has very many layers is the multiplication of the number of interfaces. These interfaces are potential paths for blocking oxygen and other metals and thus they limit interdiffusion phenomena between the substrate 2 and the alumina layer 4. The multilayer coating 3 thus increases the resilience of the entire part 1 or 1'.

Another advantage of a multilayer coating 3 is its wear mechanism. At each interface between two successive layers, there are compression and tension strains. Thus, cracks that may appear propagate preferentially along the interfaces rather than perpendicular to the layers. Due to the large number of interfaces, the life of the part 1 or 1' is increased.

Finally, the multiplication of the layers of the coating 3 makes it possible to combine different types of coating material and to increase the overall impermeability of the coating 3 in the event of a defect and/or crack in some of its layers.

Furthermore, each layer 31, 32 which contains silicon has a very particular role.

Some of the silicon in the third-type layer 32 diffuses in the grain boundaries of the contiguous alumina layer 4 and in the other layer contiguous to it, namely the aluminium layer 302 or the platinum layer 301 according to the order in which they were deposited.

Under turbine blade operating conditions, i.e. in the temperature range from 800° C. to 1600° C., silicon in the alumina grain boundaries reacts with hot gases produced in the aircraft combustion chamber, such as oxygen and/or nitrogen, to form silicon oxide ($SiO_2$) and/or silicon nitride ($Si_3N_4$).

This silicon oxide and this nitride constitute a very effective diffusion barrier against oxygen because their diffusion coefficients are relatively low.

By diffusing into the grain boundaries of the alumina layer 4, the silicon slows down the oxidation of the alumina layer, increases its life and thus the life of the entire part 1, 1'.

In turn, the silicon in the second-type layer 31 serves as a reservoir for the silicon in the third-type layer 32, in the event that this silicon of the third-type layer 32 is completely consumed. When there are several layers 31, the silicon therein plays the same role.

The invention claimed is:

1. A process for manufacturing a part comprising a nickel-based single-crystal superalloy substrate, wherein the process comprises the steps consisting in:
    manufacturing a nickel-based single-crystal superalloy substrate,
    forming, on said substrate, a coating comprising at least one layer of a first type comprising aluminium and platinum, at least one layer of a second type comprising aluminium, silicon and platinum and a layer of a third type comprising nickel, aluminium, silicon and platinum, this third-type layer being furthest outside the layer stack of the coating,
    forming a silicon-doped alumina layer on said third type layer.

2. The process according to claim 1, wherein said coating comprises at least three first-type layers.

3. The process according to claim 1, wherein said coating comprises two second-type layers.

4. The process according to claim 1, wherein said coating comprises a succession of first-type layers and/or a succession of second-type layers.

5. The process according to claim 1, wherein in said coating, the layer in contact with the nickel-based single-crystal superalloy substrate is a first-type layer.

6. The process according to claim 1, wherein at least one of the layers among the first-type layer, the second-type layer and the third-type layer is formed:
    for said first-type layer by depositing a nanocrystalline layer of aluminium and then a nanocrystalline layer of platinum, or vice versa,
    for said second-type layer by depositing, in any order, a nanocrystalline layer of aluminium, a nanocrystalline layer of platinum and a nanocrystalline layer of silicon,
    and for said third-type layer by depositing, in any order, a nanocrystalline layer of aluminium, a nanocrystalline layer of platinum, a nanocrystalline layer of nickel and a nanocrystalline layer of silicon,
    and in that said nanocrystalline layers are subjected to a diffusion treatment, so as to form said coating.

7. The process according to claim 1, wherein the deposition of the different layers of the coating is carried out by physical vapour deposition or chemical vapour deposition.

8. The process according to claim 7, wherein the deposition of the individual layers of the coating is carried out by cathode sputtering.

9. The process according to claim 1, wherein it comprises an additional step consisting in depositing a thermal barrier on said silicon-doped alumina layer.

10. A part comprising a nickel-based single-crystal superalloy substrate, wherein it comprises successively on said substrate, a coating covered with a silicon-doped alumina layer, said coating comprising at least one layer of a first type comprising aluminium and platinum, at least one layer of a second type comprising aluminium, silicon and platinum and a layer of a third type comprising nickel, aluminium, silicon and platinum, this third-type layer being located furthest outside the layer stack of the coating.

11. The part according to claim 10, wherein said silicon-doped alumina layer is covered with a thermal barrier.

* * * * *